United States Patent
Chen et al.

(10) Patent No.: US 9,389,251 B2
(45) Date of Patent: Jul. 12, 2016

(54) VOLTAGE-STACKED SYSTEM FOR MANAGING STACKED VOLTAGE SOURCES BY USING MULTIPLE MONITORING CIRCUITS

(71) Applicant: POWERFLASH TECHNOLOGY CORPORATION, Hsinchu County (TW)

(72) Inventors: Chun-Ming Chen, Hsinchu (TW); Chang-Fu Hsia, Taichung (TW); Sheng-An Yang, Kaohsiung (TW); Yuan-Chi Ho, Hsinchu (TW)

(73) Assignee: POWERFLASH TECHNOLOGY CORPORATION, Jhubei, Hsinchu County (TW)

( * ) Notice: Subject to any disclaimer, the term of this patent is extended or adjusted under 35 U.S.C. 154(b) by 490 days.

(21) Appl. No.: 14/056,976

(22) Filed: Oct. 18, 2013

(65) Prior Publication Data

US 2014/0368040 A1    Dec. 18, 2014

(30) Foreign Application Priority Data

Jun. 13, 2013 (TW) .............................. 102120968 A (51) Int. Cl.
*H02J 1/00* (2006.01)
*G01R 19/25* (2006.01)
*G01R 31/36* (2006.01)
*H01M 10/48* (2006.01)

(52) U.S. Cl.
CPC ............ *G01R 19/25* (2013.01); *G01R 31/3658* (2013.01); *H01M 10/482* (2013.01); *Y10T 307/549* (2015.04)

(58) Field of Classification Search
CPC .. G01R 19/25; G01R 31/3658; H01M 10/482
See application file for complete search history.

(56) References Cited

U.S. PATENT DOCUMENTS

| | | | | |
|---|---|---|---|---|
| 6,020,717 A | * | 2/2000 | Kadouchi | B60L 11/1851 320/116 |
| 8,072,341 B2 | | 12/2011 | Sheng | |
| 2009/0208821 A1 | * | 8/2009 | Kosugi | B60L 3/0046 429/61 |

FOREIGN PATENT DOCUMENTS

| | | |
|---|---|---|
| CN | 101656549 A | 2/2010 |
| EP | 2472939 A1 | 7/2012 |
| TW | 564956 | 12/2003 |
| TW | 200713966 | 4/2007 |
| TW | 200933180 | 8/2009 |
| TW | 201203773 | 1/2012 |
| TW | M447521 | 2/2013 |

* cited by examiner

*Primary Examiner* — Kenneth B Wells
*Assistant Examiner* — Rafael Pacheco
(74) *Attorney, Agent, or Firm* — Winston Hsu; Scott Margo (57) ABSTRACT

A voltage-stacked system includes a first voltage source, at least one second voltage source, a master monitoring circuit and at least one slave monitoring circuit. The first voltage source and the at least one second voltage source are coupled in series. The master monitoring circuit is coupled to the first voltage source, and arranged for monitoring and controlling the first voltage source and transmitting a monitoring signal. The at least one slave monitoring circuit is respectively coupled to the at least one second voltage source and the master monitoring circuit for monitoring and controlling the at least one second voltage source, and accordingly sending a response signal to the master monitoring circuit.

10 Claims, 7 Drawing Sheets

S_CTRL

| ID | CMD | CRC |

FIG. 3A

S_RES

| DAT | CRC |

VOLTAGE-STACKED SYSTEM FOR MANAGING STACKED VOLTAGE SOURCES BY USING MULTIPLE MONITORING CIRCUITS

BACKGROUND OF THE INVENTION

1. Field of the Invention

The present invention relates to a mechanism for monitoring a voltage-stacked system, and more particularly, to a mechanism of a voltage-stacked system capable of utilizing a plurality of monitoring circuits to manage a plurality of stacked voltage sources coupled in series.

2. Description of the Prior Art

With the trend that the portable electronic devices are designed in small sizes, the portable electronic devices such as the personal digital assistant (PDA), digital camera, portable audio/video (AV) player, notebook and tablet are becoming more and more popular. To achieve portability, these portable electronic devices mainly utilize the batteries as their power sources. When the electricity of a battery device is depleted, it can be charged by a dedicated charger or by directly connecting to an alternative current (AC) voltage source. Due to the limited voltage level and electric capacity of a single battery, in some occasions, many batteries are combined to form a voltage-stacked device such as a battery set to provide higher voltage and more electric capacity.

The battery set can be charged and discharged many times till its service life ends. The service life of a battery set depends on the physical characteristic and charging mode of the batteries in the battery set. In general, when larger charging voltage/current is used, the charging period is shorter. But, larger charging voltage/current might reduce the service life of the battery. Hence, although over-discharging or over-charging can increase the capacity of the battery, the service life of the battery would be shortened.

Due to the manufacturing errors, the characteristic and aging rate of each battery of the battery set might be different from one another. A battery having greater capacity tends to be under a light charging/light discharging state, and a battery having smaller capacity tends to be under an over charging/over discharging state. If each of the batteries has a different level of charging/discharging state in a long term, the difference of the characteristics possessed by the batteries will be more obvious. Although the batteries with larger capacity can be still functional under the condition where the batteries with smaller capacity fail earlier, the overall performance and service life of the battery set will decrease rapidly. Hence, there is a need to individually monitor each battery to prevent it from being over-charged/over-discharged or damaged.

The monitoring circuit of the voltage system is usually implemented with integrated circuits. However, the voltage rating of an integrated circuit chip is limited. When a voltage-stacked system with a high total voltage is to be monitored, multiple integrated circuit chips can be used to monitor serially-coupled voltage sources in such a way that the voltage endured by each integrated circuit chip is reduced. However, such monitoring structure causes the ground voltage levels of the chips to be different. When one chip needs to collect the monitoring information from other chips, the communication link connected therebetween are generally implemented using expensive optical coupling elements or complicate voltage level shifting circuits.

Hence, there is a need to provide a simple communication circuit and mechanism to collect the monitoring data of the voltage-stacked device to facilitate intelligent management to increase the efficiency and service life of the voltage-stacked device.

SUMMARY OF THE INVENTION

In accordance with exemplary embodiments of the present invention, a voltage-stacked system capable of individually managing each of the voltage sources stacked in series is proposed to solve the above-mentioned problem.

According to an embodiment of the present invention, a voltage-stacked system is disclosed. The voltage-stacked system includes a first voltage source, at least one second voltage source, a master monitoring circuit and at least one slave monitoring circuit. The first voltage source and the at least one second voltage source are coupled in series. The master monitoring circuit is coupled to the first voltage source, and arranged for monitoring and controlling the first voltage source and transmitting a monitoring signal. The at least one slave monitoring circuit is respectively coupled to the at least one second voltage source and the master monitoring circuit for monitoring and controlling the at least one second voltage source, and accordingly sending a response signal to the master monitoring circuit.

The voltage-stacked system provided by the present invention capable of individually managing each of the voltage sources stacked in series is proposed to solve the above-mentioned problem, thus improving the overall efficiency of the voltage-stacked device and extending the service life of the voltage-stacked device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention provides a voltage-stacked system capable of individually managing a plurality of serially coupled stacked voltage sources. In this way, the objective of increasing the service life of a voltage-stacked system is achieved. Besides, the hardware requirement can be relaxed. Further details are described as below.

Figure 1:
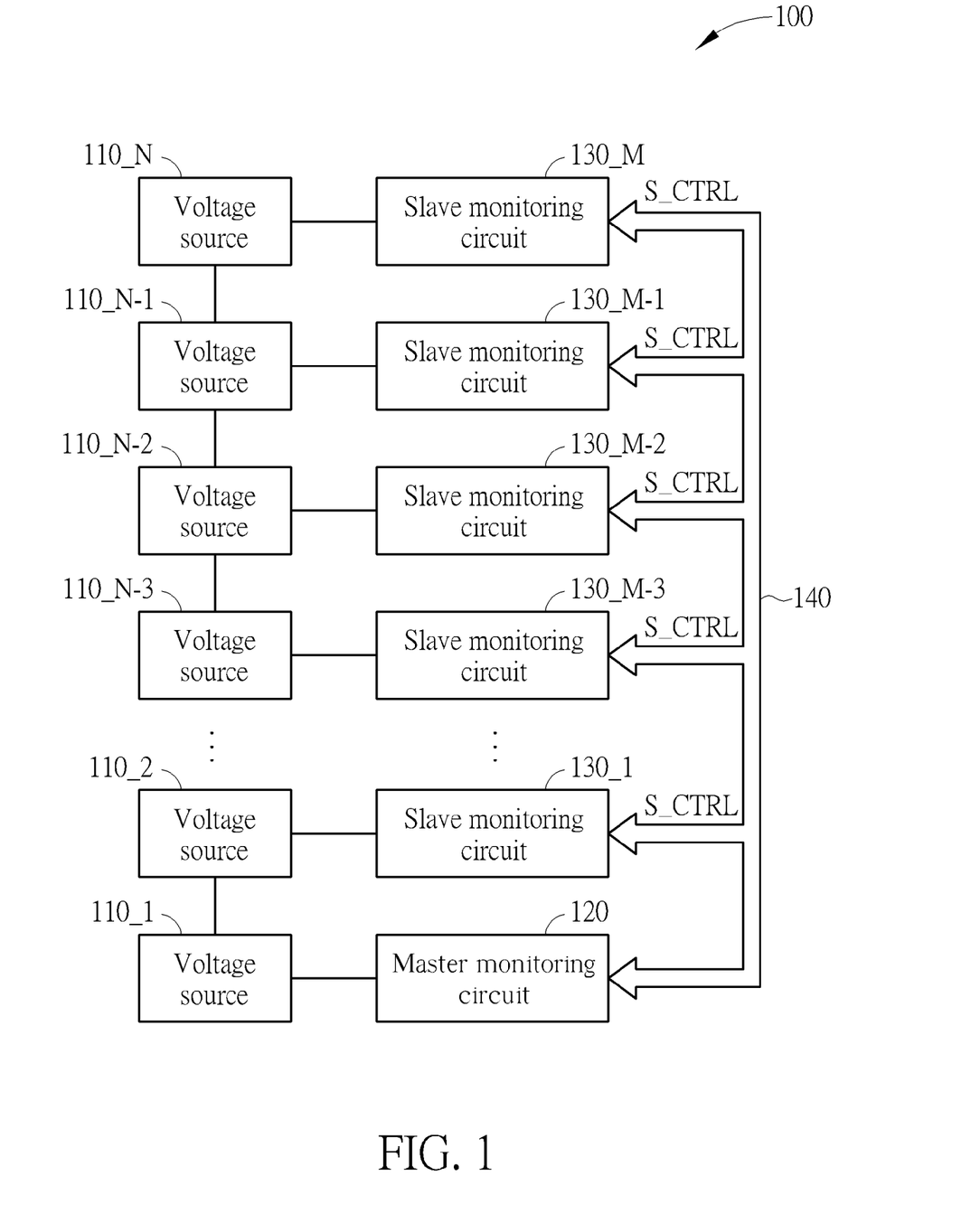
FIG. 1 is a block diagram illustrating a voltage-stacked system according to an embodiment of the present invention.

Please refer to FIG. 1, which is a block diagram illustrating a voltage-stacked system 100 according to an embodiment of the present invention. The voltage-stacked system 100 has a plurality of voltage sources 110_1-110_N, a master monitoring circuit 120, a plurality of slave monitoring circuit 130_1-130_M and a communication bus 140. In this embodiment, each of the voltage sources 110_1-110_N may be a battery for providing a voltage of V volts. The voltage sources 110_1-110_N are serially coupled to form a voltage-stacked system for providing a total voltage of N×V volts. The master monitoring circuit 120 is coupled to the first voltage source 110_1, and arranged for monitoring and controlling the first voltage source 110_1. The slave monitoring circuit 130_1-130_M are coupled to the voltage sources 110_2-110_N, respectively, and arranged for monitoring and controlling the voltage sources 110_2-110_N, respectively. Besides, the communication bus 140 is coupled to the master monitoring circuit 120 and the slave monitoring circuits 130_1-130_M, and arranged for transmitting signals between the master monitoring circuit 120 and the slave monitoring circuits 130_1-130_M. In other words, the monitoring circuit 120 can transmit a monitoring signal S_CTRL to each of the slave monitoring circuits 130_1-130_M through the communication bus 140, to control the slave monitoring circuits 130_1-130_M to monitor and control the voltage sources 110_2-110_N, respectively. Each of the slave monitoring circuits 130_1-130_M will further transmit a response signal S_RES to the master monitoring circuit 120 through the communication bus 140 according to the instruction of the monitoring signal S_CTRL. For example, the master monitoring circuit 120 can transmit the monitoring signal S_CTRL to the slave monitoring circuit 130_5 to instruct the slave monitoring circuit 130_5 to perform voltage measurement on the voltage source 110_6. The slave monitoring circuit 130_5 will measure the voltage of the voltage source 110_6 upon receiving the monitoring signal S_CTRL, and then transmits back the measured voltage to the master monitoring circuit 120 through the response signal S_RES. Please note that, for clarity and simplicity, this exemplary embodiment employs a structure which using one monitoring circuit for monitoring and controlling only one voltage source. However, the present invention is not limited thereto. In some alternative designs, one monitoring circuit may be used to monitor and control multiple voltage sources. Further, the number of the voltage sources N and the number of the slave monitoring circuits M can be adjusted, depending upon the actual design requirement/consideration.

In the present embodiment, the master monitoring circuit 120 and the slave monitoring circuit 130_1-130_M are coupled to the voltage sources 110_1-110_N, respectively, and the voltage sources 110_1-110_N are serially coupled to each other. Hence, ground voltage levels of the master monitoring circuit 120 and the slave monitoring circuit 130_1-130_M are different from one another. In this way, when the master monitoring circuit 120 and the slave monitoring circuit 130_1-130_M perform signal transmissions, the signal magnitudes may be misjudged due to different ground voltage levels. For example, the highest supply voltage level of the master monitoring circuit 120 is the ground voltage level of the slave monitoring circuit 130_1, and the highest supply voltage level of the slave monitoring circuit 130_1 is the ground voltage level of the slave monitoring circuit 130_2, and so on. Hence, when the master monitoring circuit 120 is coupled to the slave monitoring circuit 130_1-130_M through the communication bus 140, the master monitoring circuit 120 needs to be further serially coupled to capacitive circuit elements (e.g., capacitors) to filter out the different ground voltage levels. That is, with the help of the additional serially-coupled capacitive circuit element (e.g., capacitor), when signals are transmitted between the master monitoring circuit 120 and one of the slave monitoring circuit 130_1-130_M, only the variation component (i.e., the AC component) of the signal can pass through. In this way, misjudging the signal magnitudes due to the differences between the ground voltage levels of the monitoring circuits can be avoided.

Figure 2A:
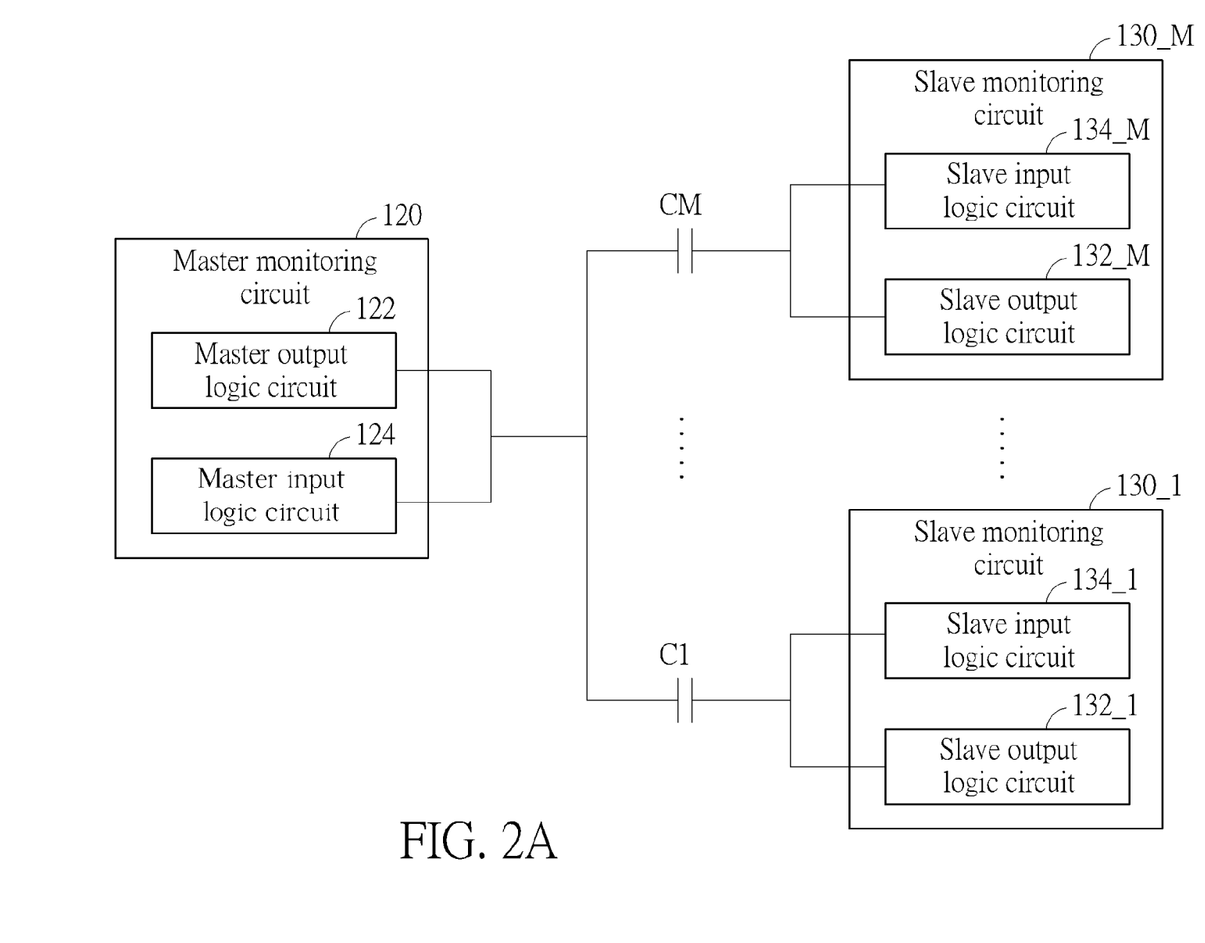
FIG. 2A shows the circuit structure of a master monitoring circuit coupled to slave monitoring circuits according to a first embodiment of the present invention.

Please refer to FIG. 2A, which shows the circuit structure of the master monitoring circuit 120 coupled to slave monitoring circuits 130_1-130_M according to a first embodiment of the present invention. As shown in FIG. 2A, the master monitoring circuit 120 has a master output logic circuit 122 and a master input logic circuit 124. The slave monitoring circuits 130_1-130_M have slave output logic circuits 132_1-132_M and slave input logic circuits 134_1-134_M, respectively. In this embodiment, the master monitoring circuit 120 and the slave monitoring circuits 130_1-130_M can selectively turn on/off the input logic circuit or the output logic circuit. When the output logic circuit is turned on, the input logic circuit can be turned off to avoid receiving signals outputted from the output logic circuit of the same monitoring circuit. Hence, the master monitoring circuit 120 can be directly coupled to the slave monitoring circuits 130_1-130_M through capacitive circuit elements (e.g., capacitors) C1-CM, respectively.

Figure 2B:
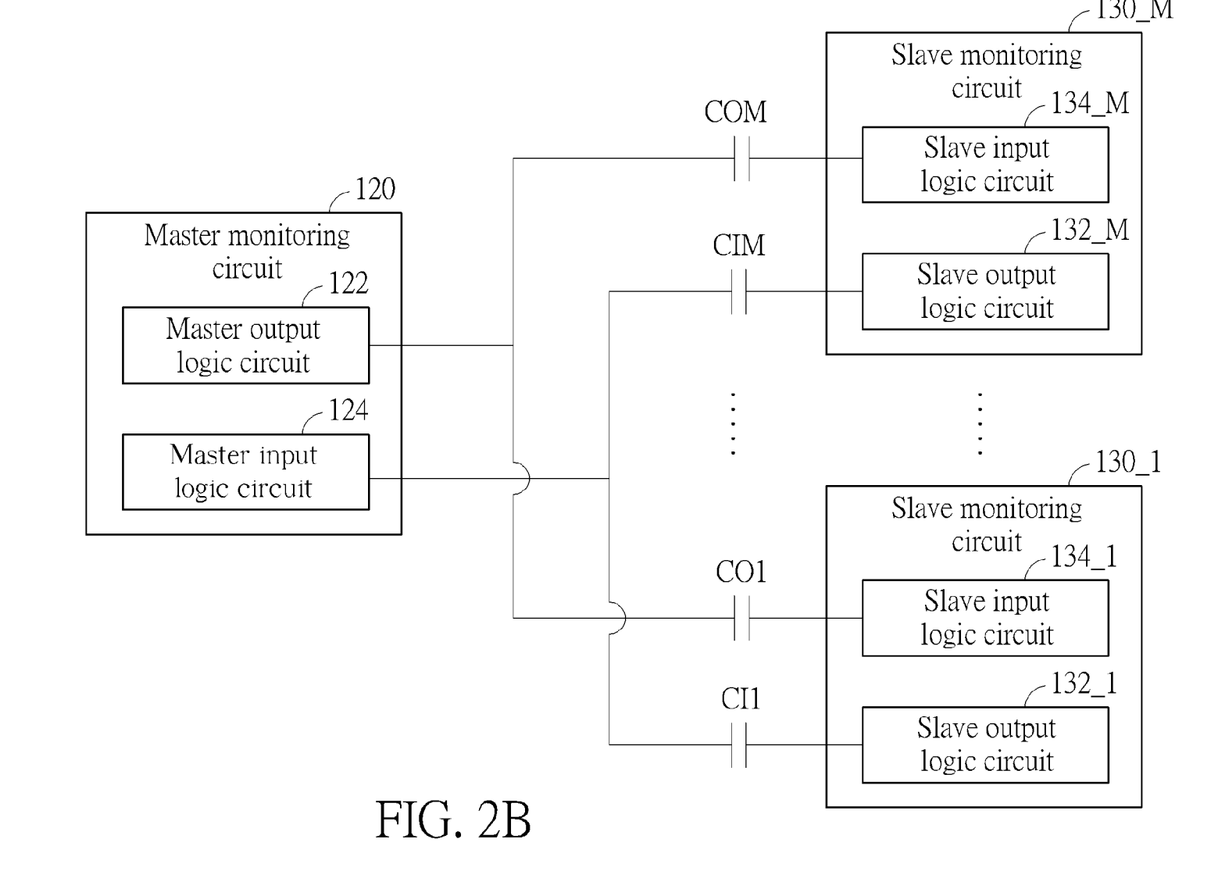
FIG. 2B shows the circuit structure of a master monitoring circuit coupled to slave monitoring circuits according to a second embodiment of the present invention.

Please refer to FIG. 2B, which shows the circuit structure of the master monitoring circuit 120 coupled to slave monitoring circuits 130_1-130_M according to a second embodiment of the present invention. The difference between FIGS. 2A and 2B is that, since the master monitoring circuit 120 and the slave monitoring circuit 130_1-130_M in FIG. 2B can not selectively turn on/off the input logic circuits or the output logic circuits, the slave output logic circuits 132_1-132_M and the slave input logic circuits 134_1-134_M will require different capacitive elements to couple to the master input logic circuit 124 and the master output logic circuit 122, respectively. That is, the master input logic circuit 124 is coupled to the slave output logic circuits 1321-132M through a plurality of capacitive circuit elements (e.g., capacitors) CO1-COM, respectively, and the master output logic circuit 122 is coupled to the slave input logic circuits 134_1-134_M through a plurality of capacitive circuit elements (e.g., capacitors) CI1-CIM, respectively.

Figure 3A:
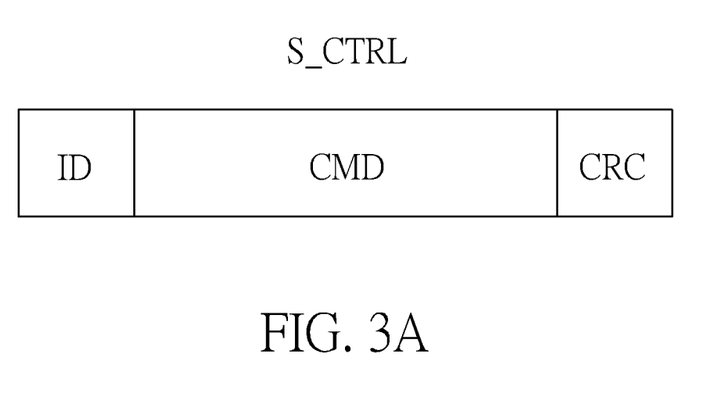
FIG. 3A shows the format of a monitoring signal according to an embodiment of the present invention.

Please refer to FIG. 3A, which shows the format of the monitoring signal S_CTRL according to an embodiment of the present invention. As shown in FIG. 3A, the monitoring signal S_CTRL has an identification code segment ID, a command segment CMD and an error check code segment CRC. The identification code segment ID is used to indicate which one of the slave monitoring circuits should receive the monitoring signal S_CTRL. That is, if the monitoring signal S_CTRL is to be sent to a designated slave monitoring circuit, the identification code segment ID will have an identification code corresponding to the designated slave monitoring circuit. The command segment CMD is used to indicate an operation (e.g., measuring a voltage, enabling the battery balance function, etc.) that the designated slave monitoring circuit which receives the monitoring signal S_CTRL should perform. The error check code segment CRC is a cyclic redundancy check (CRC) code, and thus allows the designated slave monitoring circuit which receives the monitoring signal S_CTRL to check the accuracy/integrity of the received monitoring signal S_CTRL. The identification code segment ID, the command segment CMD and the error check code segment CRC can be identified according to the bit order thereof. For example, from left to right in FIG. 3A, the first three bits in the monitoring signal S_CTRL can be defined as the identification code segment ID, the last bit in the monitoring signal S_CTRL can be defined as the error check code segment CRC, and the rest of the bits in the monitoring signal S_CTRL can be defined as the command segment CMD. However, the above example is for illustrative purposes only, and is not meant to be a limitation of the present invention.

Figure 3B:
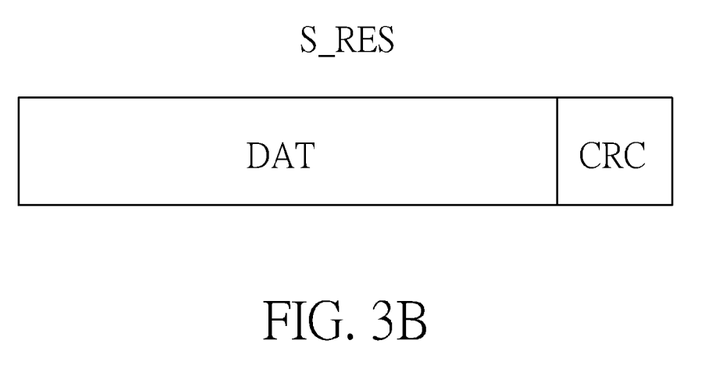
FIG. 3B shows the format of a response signal according to an embodiment of the present invention.

Please refer to FIG. 3B, which shows the format of a response signal S_RES according to an embodiment of the present invention. As shown in FIG. 3B, the response signal S_RES has a data segment DAT and an error check code segment CRC. The data segment DAT is used to carry the data that the designated slave monitoring circuit which receives the monitoring signal S_CTRL needs to transmit back, such as a measured voltage value in response to a command to measure the voltage value of a voltage source or an acknowledgement (ACK) in response to a command to enable the battery balance operation or a non-acknowledgement (NACK) to indicate the S_CTRL signal not being correctly received. The error check code segment CRC is a cyclic redundancy check code, and thus allows the master monitoring circuit to check the accuracy/integrity of the received response signal S_RES. The way to identify the data segment DAT and the error check code segment CRC from each other can be based on the bit order thereof. For example, from left to right in FIG. 3B, the last bit in the response signal S_RES can be defined as the error check code segment CRC, and the rest of the bits in the response signal S_RES can be defined as the data segment DAT. However, the above example is for illustrative purposes only, and is not meant to be a limitation of the present invention.

Figure 3C:
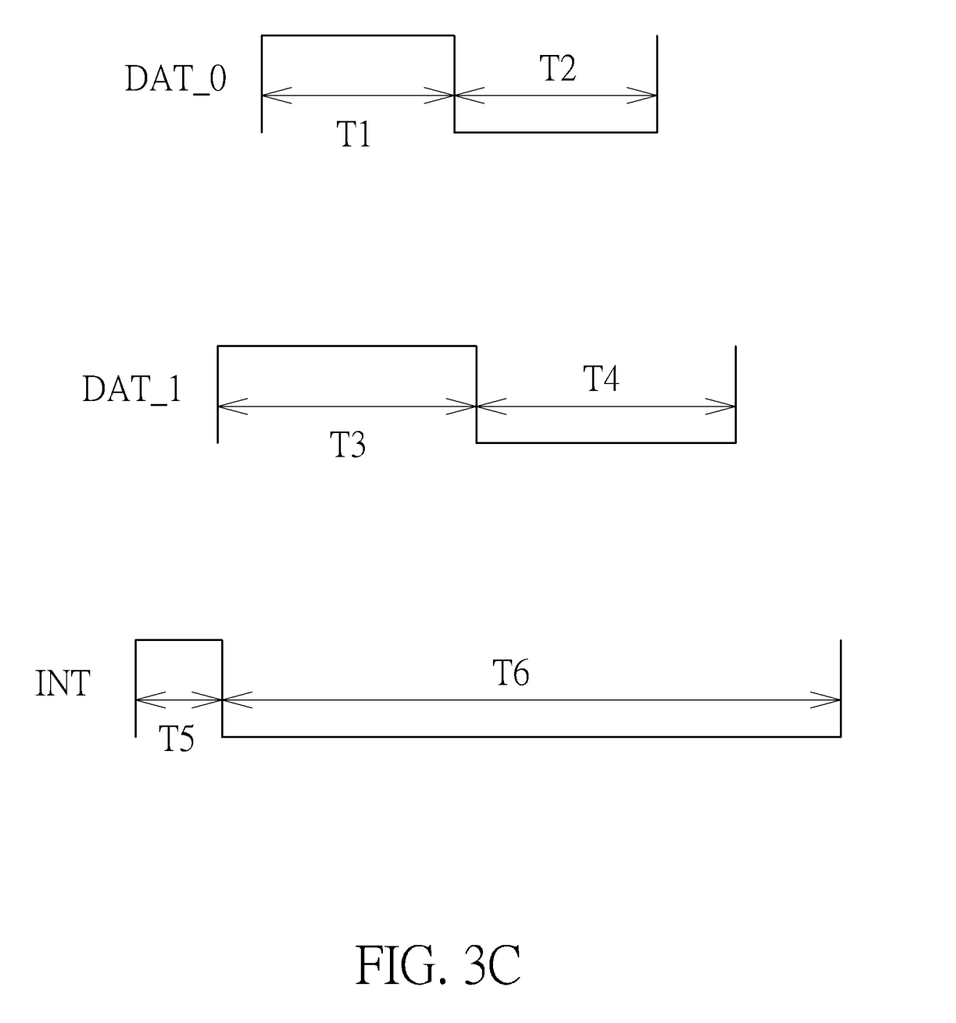
FIG. 3C shows a signal design according to an embodiment of the present invention.

Please refer to FIG. 3C, which shows a signal design according to an embodiment of the present invention. As shown in FIG. 3C, the bit "0" is represented by a first data signal DAT_0. The first data signal DAT_0 has a first high-level period T1 and a first low-level period T2. Further, the bit "1" is represented by a second data signal DAT_1. The second data signal DAT_1 has a second high-level period T3 and a second low-level period T4. As shown in FIG. 3C, when the first high-level period T1, the first low-level period T2, the second high-level period T3 and the second low-level period T4 have different lengths, the first data signal DAT_0 and the second data signal DAT_1 can be correctly distinguished from each other by a receiving end. Hence, the first data signal DAT_0 and the second data signal DAT_1 can be used to realize the coding of the monitoring signal S_CTRL and the response signal S_RES.

Moreover, to avoid the undesired signal collisions on the communication bus 140, the master monitoring circuit 120 can determine the timing of transmitting the monitoring signal S_CTRL by using a polling manner. That is, all the monitoring circuits are initially in a receiving state. When the master monitoring circuit 120 needs to communicate with one of the slave monitoring circuits 130_1-130_M, the master monitoring circuit 120 first transmits an initiating signal INT to inform all of the slave monitoring circuits 130_1-130_M that there will be a monitoring signal S_CTRL transmitted next. Then, the master monitoring circuit 120 will go on transmitting the monitoring signal S_CTRL to all of the slave monitoring circuits 130_1-130_M. Please note that, in this embodiment, to enhance the identifiability of the initiating signal INT, the initiating signal INT is not composed of the first data signals DAT_0 and/or the second data signals DAT_1. As shown in FIG. 3C, the initiating signal INT has a third high-level period T5 and a third low-level period T6, wherein the first high-level period T1, the first low-level period T2, the second high-level period T3, the second low-level period T4, the third high-level period T5 and the third low-level period T6 have different lengths.

The operation of the master monitoring circuit 120 can be simplified as a flowchart. Please refer to FIG. 4, which is a flowchart illustrating the master monitoring circuit 120 performing a polling operation according to an embodiment of the present invention. Provided that the result is substantially the same, the steps are not required to be executed in the exact order shown in FIG. 4. The operation of the master monitoring circuit 120 can be briefly summarized using following steps.

Figure 4:
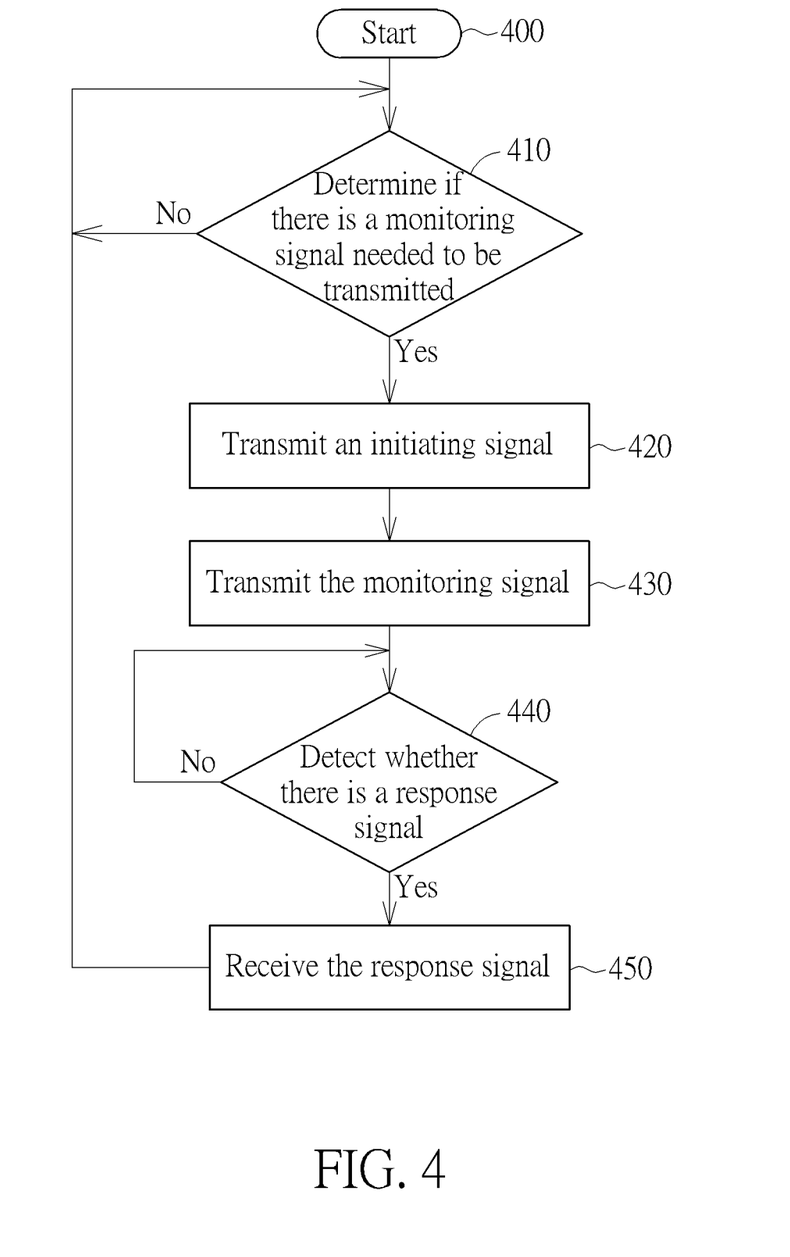
FIG. 4 is a flowchart illustrating the master monitoring circuit performing a polling operation according to an embodiment of the present invention.

Step 400: Start.

Step 410: Determine if there is a monitoring signal needed to be transmitted. If yes, go to step 420; otherwise, repeat step 410.

Step 420: Transmit an initiating signal.

Step 430: Transmit the monitoring signal.

Step 440: Detect whether there is a response signal. If yes, go to step 450; otherwise, repeat step 440.

Step 450: Receive the response signal, and then go to step 410.

As a person skilled in the art can readily understand details of each step shown in FIG. 4 after reading above paragraphs directed to the voltage-stacked system 100 shown in FIG. 1, further description is omitted here for brevity.

Further, with regard to the slave monitoring circuits 130_1-130_M, they initially monitor the communication bus 140 to detect whether there is an initiating signal INT generated from the master monitoring circuit 120. When the initiating signal INT from the master monitoring circuit 120 is detected, all of the slave monitoring circuits 130_1-130_M will receive the monitoring signal S_CTRL. Each of the slave monitoring circuits 130_1-130_M checks if the identification code segment ID in the monitoring signal SCTRL is identical to its identification code. If the identification code segment ID in the monitoring signal SCTRL received by a slave monitoring circuit is the identification code of the slave monitoring circuit, the slave monitoring circuit operates according to the contents indicated by the command segment CMD in the monitoring signal S_CTRL, and sends a response signal S_RES to the master monitoring circuit 120 to report the data demanded by the command segment CMD or report whether the action indicated by the command segment CMD is successfully performed. If the identification code segment ID in the monitoring signal S_CTRL received by a slave monitoring circuit is not the identification code of the slave monitoring circuit, the slave monitoring circuit will keep monitoring the communication bus 140 to detect whether there is another initiating signal INT generated from the master monitoring circuit 120.

The operation of the slave monitoring circuits 130_1-130_M can also be simplified as a flowchart. Please refer to FIG. 5, which is a flowchart illustrating the operation of the slave monitoring circuits 130_1-103_M according to an embodiment of the present invention. Provided that the result is substantially the same, the steps are not required to be executed in the exact order shown in FIG. 5. The operation of each of the slave monitoring circuits 130_1-130_M can be briefly summarized using following steps.

Figure 5:
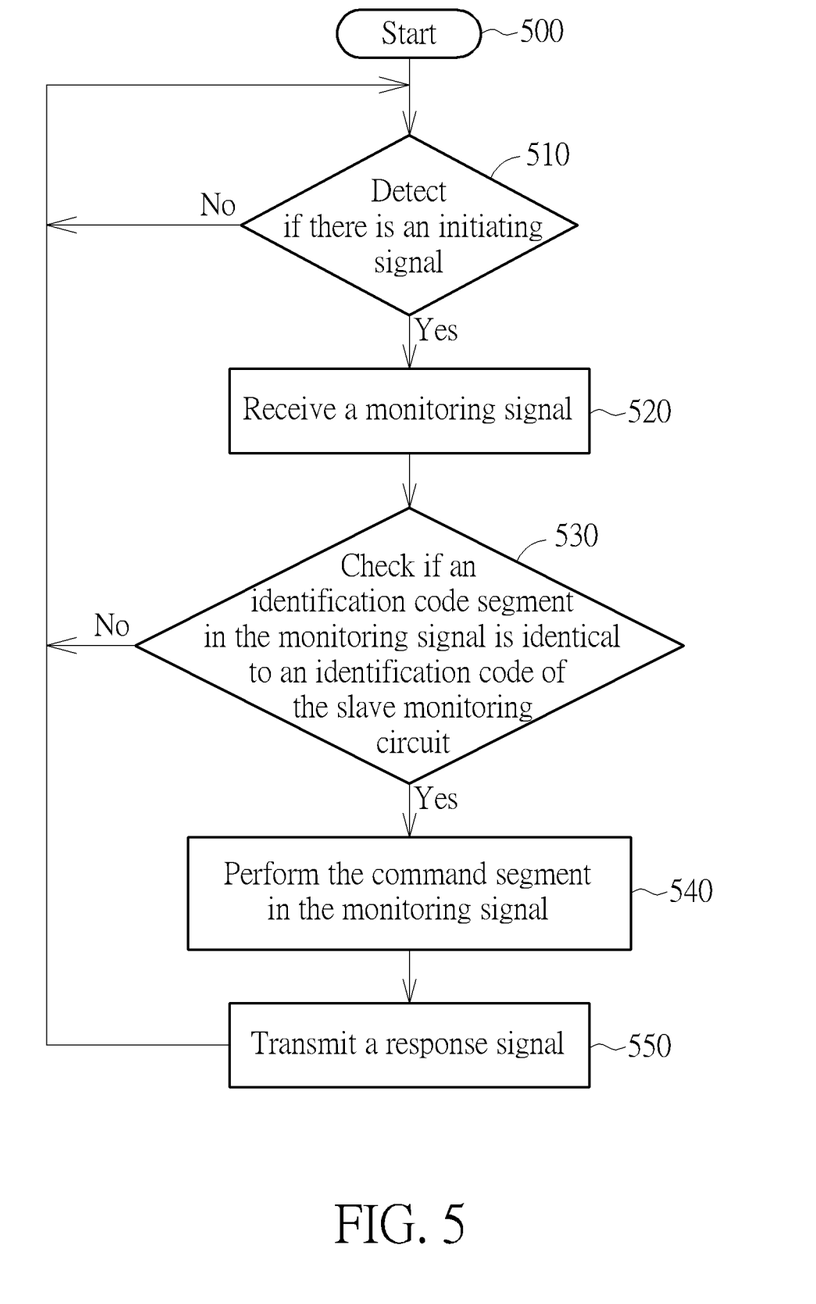
FIG. 5 is a flowchart illustrating the operation of the slave monitoring circuits according to an embodiment of the present invention.

Step 500: Start.

Step 510: Detect if there is an initiating signal. If yes, go to step 520; otherwise, repeat step 510.

Step 520: Receive a monitoring signal.

Step 530: Check if an identification code segment in the monitoring signal is identical to an identification code of the slave monitoring circuit. If yes, go to step 540; otherwise, go to step 510.

Step 540: Perform the command segment in the monitoring signal.

Step 550: Transmit a response signal, and then go to step 510.

As a person skilled in the art can readily understand details of each step shown in FIG. 5 after reading above paragraphs directed to the voltage-stacked system 100 shown in FIG. 1, further description is omitted here for brevity.

In summary, the present invention provides a voltage-stacked system capable of individually managing a plurality of serially coupled stacked voltage sources, thereby enhancing the overall efficiency of the voltage-stacked system and increasing the service life of the voltage-stacked system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage-stacked system, comprising:
 a plurality of voltage sources, comprising:
  a first voltage source; and
  at least one second voltage source, wherein the first voltage source and the at least one second voltage source are coupled in series;
 a master monitoring circuit, coupled to the first voltage source, the master monitoring circuit arranged for monitoring and controlling the first voltage source and transmitting a monitoring signal; and
 at least one slave monitoring circuit, coupled to the at least one second voltage source and the master monitoring circuit, the at least one slave monitoring circuit arranged for monitoring and controlling the at least one second voltage source, and accordingly sending a response signal to the master monitoring circuit.

2. The voltage-stacked system of claim 1, wherein the at least one slave monitoring circuit is coupled to the master monitoring circuit through at least one capacitive element.

3. The voltage-stacked system of claim 2, wherein:
 the master monitoring circuit comprises a master output logic circuit and a master input logic circuit;
 each slave monitoring circuit of the at least one slave monitoring circuit comprises a slave output logic circuit and a slave input logic circuit;
 the slave output logic circuit of each slave monitoring circuit of the at least one slave monitoring circuit is coupled to the master input logic circuit through a first capacitive element; and
 the slave input logic circuit of each slave monitoring circuit of the at least one slave monitoring circuit is coupled to the master output logic circuit through a second capacitive element.

4. The voltage-stacked system of claim 1, further comprising:
 a communication bus, coupled to the master monitoring circuit and the at least one slave monitoring circuit, the communication bus arranged for transmitting the monitoring signal from the master monitoring circuit to the at least one slave monitoring circuit, and transmitting the response signal from the at least one slave monitoring circuit to the master monitoring circuit.

5. The voltage-stacked system of claim 1, wherein the master monitoring circuit transmits an initiating signal to the at least one slave monitoring circuit for polling the at least one slave monitoring circuit to determine timing for transmitting the monitoring signal.

6. The voltage-stacked system of claim 5, further comprising a data signal, arranged for performing coding of the monitoring signal and the response signal, wherein:
 the initiating signal comprises a first high-level period and a first low-level period;
 the data signal comprises a first data signal and a second data signal, the first data signal comprises a second high-level period and a second low-level period, the second data signal comprises a third high-level period and a third low-level period; and
 the first high-level period, the first low-level period, the second high-level period, the second low-level period, the third high-level period and the third low-level period have different lengths.

7. The voltage-stacked system of claim 1, wherein the monitoring signal comprises an identification code segment, a command segment and an error check code segment.

8. The voltage-stacked system of claim 7, wherein:
 the identification code segment is used to indicate a target slave monitoring circuit corresponding to the target second voltage source;
 the command segment is used to instruct the target slave monitoring circuit to perform an operation upon the target second voltage source; and
 the error check code segment is a cyclic redundancy check (CRC) code.

9. The voltage-stacked system of claim 1, wherein the response signal comprises a data segment and an error check code segment.

10. The voltage-stacked system of claim 9, wherein:
 the data segment is used to carry data transmitted from a target slave monitoring circuit corresponding to the target second voltage source; and
 the error check code segment is a cyclic redundancy check code.

* * * * *